United States Patent [19]

Makita

[11] Patent Number: 5,187,553
[45] Date of Patent: Feb. 16, 1993

[54] AVALANCHE PHOTODIODE HAVING A THIN MULTILAYER SUPERLATTICE STRUCTURE SANDWICHED BETWEEN BARRIER AND WELL LAYERS TO REDUCE ENERGY LOSS

[75] Inventor: Kikuo Makita, Tokyo, Japan

[73] Assignee: NEC Corporation, Tokyo, Japan

[21] Appl. No.: 687,346

[22] Filed: Apr. 18, 1991

[30] Foreign Application Priority Data

Apr. 18, 1990 [JP] Japan .................. 2-102454

[51] Int. Cl.$^5$ .................. H01L 27/14; H01L 31/00
[52] U.S. Cl. .................. 257/187; 257/21; 257/458
[58] Field of Search .................. 357/4, 16, 30 A, 30 B, 357/30 E, 30 L, 30 D, 30 R, 56, 30 F

[56] References Cited

U.S. PATENT DOCUMENTS

| | | | |
|---|---|---|---|
| 4,684,969 | 8/1987 | Taguchi | 357/16 |
| 4,731,641 | 3/1988 | Matsushima et al. | 357/16 |
| 4,982,255 | 1/1991 | Tomita | 357/30 A |

FOREIGN PATENT DOCUMENTS

| | | | |
|---|---|---|---|
| 0299841 | 1/1989 | European Pat. Off. | 357/30 E |
| 1-144687 | 6/1989 | Japan | 357/30 A |
| 1-194476 | 8/1989 | Japan | 357/30 A |
| 2-10780 | 1/1990 | Japan | 357/30 A |
| 2-90575 | 3/1990 | Japan | 357/30 A |
| 2-119271 | 5/1990 | Japan | 357/30 A |
| 2-119274 | 5/1990 | Japan | 357/30 A |
| 2-246381 | 10/1990 | Japan | 357/30 A |
| 2-254769 | 10/1990 | Japan | 357/30 A |

OTHER PUBLICATIONS

Reithmaier et al., "Investigation of the Critical Layer Thickness in Elastically Strained InGaAs/GaAlAs... Microscopy", Appl. Phys. Lett. 54 (1), Jan. 2, 1988.

Y. Yu et al., "Impact Ionization Coefficient... Photodiodes Determined from Noise Measurements", Applied Physics Letters, vol. 51, No. 18, Nov. 2, 1987, pp. 133-1435.

T. Kagawa et al., "Impact Ionization Rates in an InGaAs/InAlAs Superlattice", Applied Physics Letters, vol. 55, No. 10. Sep. 4, 1989, pp. 993-995.

K. Brennan, "Theoretical Study of... Made From the GaInAs/AlInAs Material System", IEEE Transactions on Electron Devices, vol. ED33, No. 10, Oct. 1986, pp. 1502-1510.

*Primary Examiner*—Rolf Hille
*Assistant Examiner*—Minhloan Tran
*Attorney, Agent, or Firm*—Sughrue, Mion, Zinn, Macpeak & Seas

[57] ABSTRACT

An avalanche photodiode includes an avalanche multiplication layer consisting of a superlattice multilayer structure in which a repeated thin multilayer of short-width well layers and short-width barrier layers is sandwiched between a well layer and a barrier layer. The width of the short-width well and barrier layers is preferably up to 100 Å. In such a structure, an ionization rate of electrons in the avalanche multiplication layer increases, so that the avalanche photodiode has low-noise and high speed response performances.

3 Claims, 8 Drawing Sheets

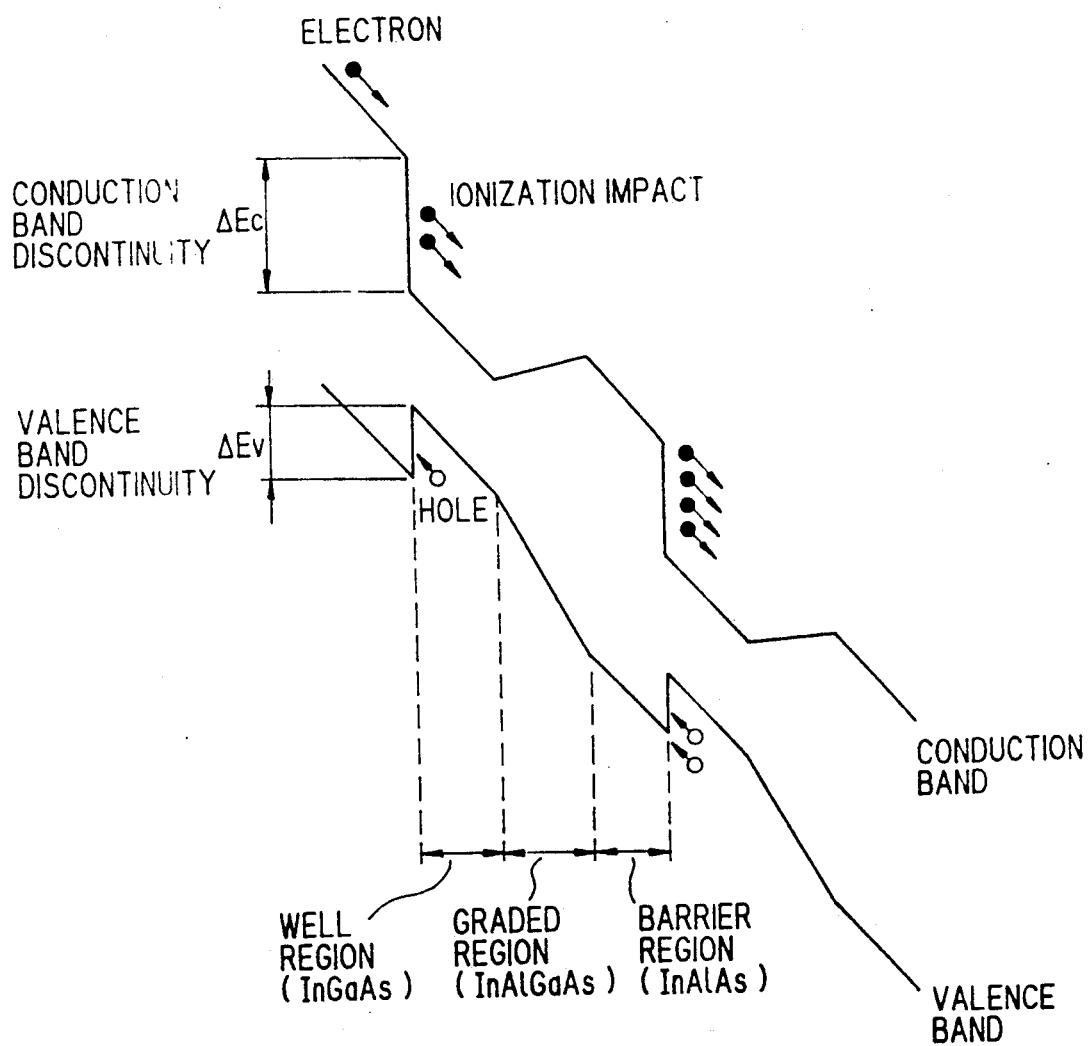

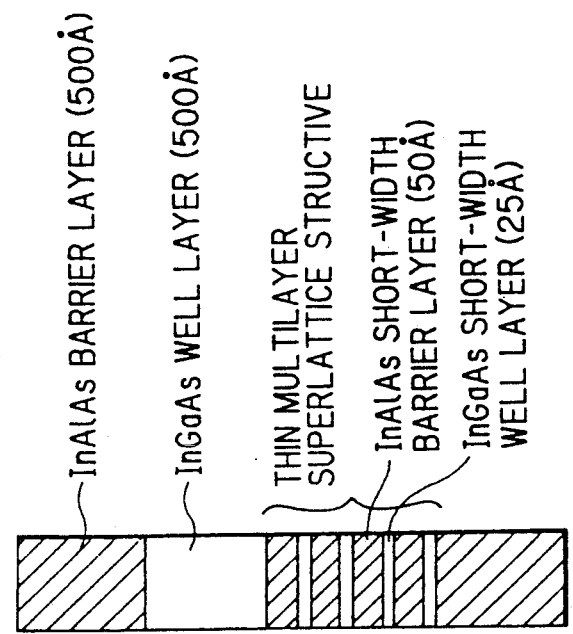
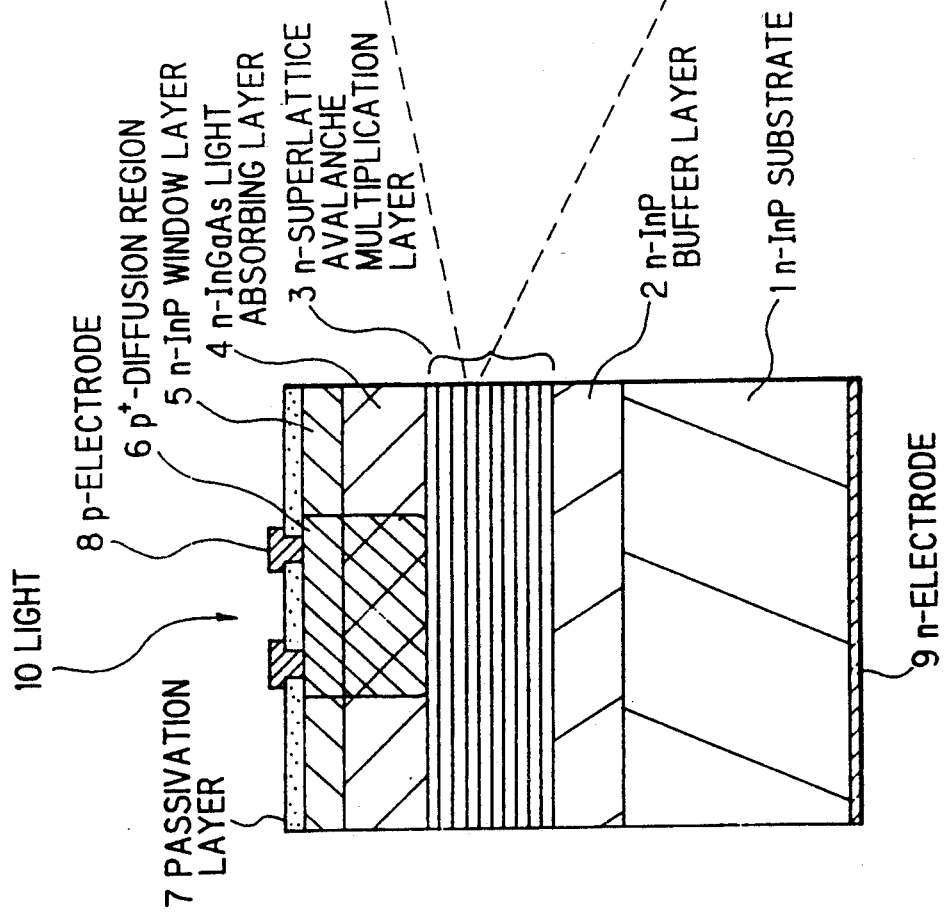

AVALANCHE PHOTODIODE HAVING A THIN MULTILAYER SUPERLATTICE STRUCTURE SANDWICHED BETWEEN BARRIER AND WELL LAYERS TO REDUCE ENERGY LOSS

FIELD OF THE INVENTION

This invention relates to an avalanche photodiode, and more particularly to an avalanche multiplication photodiode used in optical telecommunication systems.

BACKGROUND OF THE INVENTION

There are several semiconductor photodetectors sensitive to wavelengths of 1.0 to 1.6 μm for optical telecommunication systems, such as PIN photodetectors comprising a light absorbing layer of $In_{0.53}Ga_{0.47}As$ lattice matched to an InP substrate disclosed on pages 653 to 654 of "Electron. Lett. vol. 20, 1984", or an avalanche multiplication semiconductor photodetector disclosed on pages 257 to 258 of "IEEE. Electron Device Lett. vol. 7, 1986". The avalanche photodector such as an avalanche photodiode has been used in long distance optical telecommunication systems, because it has an advantage in inner gain effects and high speed response due to avalanche multiplication.

One type of a conventional avalanche photodiode comprises an n-buffer layer formed on a substrate, an n-avalanche multiplication layer formed on the buffer layer, an n-light absorbing layer formed on the avalanche multiplication layer, and a p+diffusion region formed on the avalanche multiplication layer.

In operation, a light is supplied to the avalanche photodiode which is applied with a reverse bias. The light is absorbed at the light absorbing layer to generate photocarriers, electrons and holes, of which the electrons are injected into the avalanche multiplication layer to cause ionization impacts which results in multiplication.

It is desirable that the ionization impacts which occur in the avalanche multiplication layer be carried out only by the photocarriers injected from the light absorbing layer. Therefore, it is desirable that the electron and hole ionization rates $\alpha$ and $\beta$ are vastly different ( $\alpha > \beta$ or $\alpha < \beta$ ) and that the photocarriers injected from the light absorbing layer initiate the avalanche process to provide an avalanche photodiode having low noise and high speed characteristics. The ratio $\alpha/\beta$ depends on the property of material which the avalanche multiplication layer consists of. In an InGaAs type avalanche photodiode having an InP avalanche multiplication layer in which holes are injected carriers, for instance, the ratio $\beta/\alpha$ of InP is up to 2 at the most, which is far smaller than the ratio $\alpha/\beta$ of Si which is approximately 20.

Capasso et al have suggested that the ratio $\alpha/\beta$ can be controlled artificially by using a superlattice structure having large band discontinuities as an avalanche multiplication layer, on pages 38 to 40 of "Appl. Phys. Lett. vol. 40, 1982".

In the wavelength band used for optical telecommunications (1.0 to 1.6 μm), Brennan has analyzed theoretically based on Monte Carlo technique that the ratio $\alpha/\beta$ of approximately 20 can be obtained by using InAlAs/InGaAs ($In_{0.52}Al_{0.48}As$/InGaAs in more exactitude) superlattice structure as an avalanche multiplication layer, on pages 1502 to 1510 of "IEEE. Trans. Electron Devices, ED-33, 1986". These avalanche photodiodes using the superlattice structure are expected to be superior to those using InGaAs system in the device performances.

According to the conventional avalanche photodiode using the superlattice structure, however, there is a disadvantage in that injected electrons may lose kinetic energy or may even be trapped at one end of a well layer on transferring the avalanche multiplication layer, so that the ionization rate $\alpha$ may decrease.

Brennan has suggested to provide an InAlGaAs graded region between well and barrier layers to reduce energy loss and trapping effects of electrons. However, it is very difficult to grow an InAlGaAs graded layer lattice matched with an InP substrate in light of crystal growth technique.

SUMMARY OF THE INVENTION

Accordingly, it is an object of the invention to provide an avalanche photodiode having low-noise and high speed response performances.

It is another object of the invention to provide an avalanche photodiode which is easily fabricated.

According to a feature of the invention, an avalanche photodiode comprises:

a first semiconductor layer for a light absorbing layer;

a second semiconductor layer for an avalanche multiplication layer, the second semiconductor layer comprising a superlattice multilayer structure in which each element layer consisting of alternately provided short-width well and barrier layers is sandwiched between a well layer and a barrier layer; and first and second electrodes for applying a predetermined voltage across the first and second semicondctor layers.

BRIEF DESCRIPTION OF THE DRAWINGS

The invention will be explained in more detail in conjunction with appended drawings wherein:

FIG. 3 is a simplified model illustrating the band energy in a second conventional avalanche photodiode;

FIG. 4 is a cross-sectional view illustrating an avalanche photodiode in a first preferred embodiment according to the invention;

FIG. 5 is an explanatory view illustrating a vertical structure of one element layer of an nsuperlattice avalanche multiplication layer in the avalanche photodiode in the first preferred embodiment according to the invention;

DESCRIPTION OF THE PREFERRED EMBODIMENTS

Before describing an avalanche photodiode in preferred embodiments according to the invention, the conventional avalanche photodiodes briefly described before will be explained in conjunction with FIGS. 1 to 3.

Figure 1:
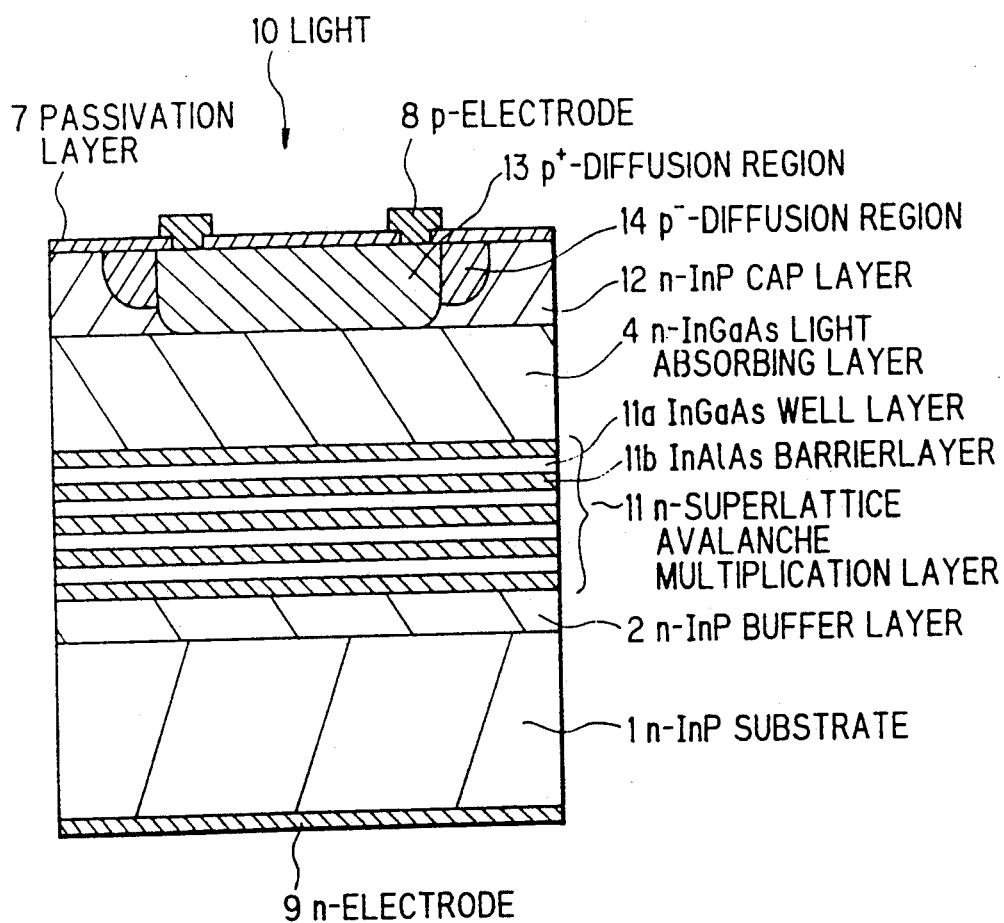
FIG. 1 is a cross-sectional view illustrating a first conventional avalanche photodiode.

FIG. 1 is a cross-section view illustrating a first conventional avalanche photodiode using InGaAs material systems.

The avalanche photodiode comprises an n-InP buffer layer 2 formed on an n-InP substrate 1, an navalanche superlattice multiplication layer 11 consisting of multilayers of interleavingly formed InGaAs well layers 11a and InAlAs barrier layers 11b formed on the n-InP buffer layer 2, an n-InGaAs light absorbing layer 4 formed on the n-avalanche superlattice multiplication layer 11, an n-InP cap layer 12 formed on the n-InGaAs light absorbing layer 4, a p+-diffusion region 13 formed within the n-InP cap layer 12, and ap⁻-diffusion region 14 formed to surround the p+-diffusion region 13. A p-electrode 8 and an n-electrode 9 are provided to have ohmic contacts with the the p+-diffusion region 13 and the n-InP substrate 1, respectively. Additionally, a passivation layer 7 is formed on a top surface of the avalanche photodiode to cover all the surface thereof except for the p-electrode 8.

In operation, a light 10 is supplied to the avalanche photodiode which is applied with a reverse bias between the p-electrode 8 and the n-electrode 9.

The light 10 thus supplied is absorbed at the nInGaAs light absorbing layer 4 to generate photocarriers, that are electrons and holes. The holes drifts toward thep+-diffusion region 13, while the electrons are injected into the avalanche superlattice multiplication layer 11. There is a high intensity of field applied in the avalanche superlattice multiplication layer 11, so that ionization impacts by the injected electrons occur to cause multiplication.

Figure 2:
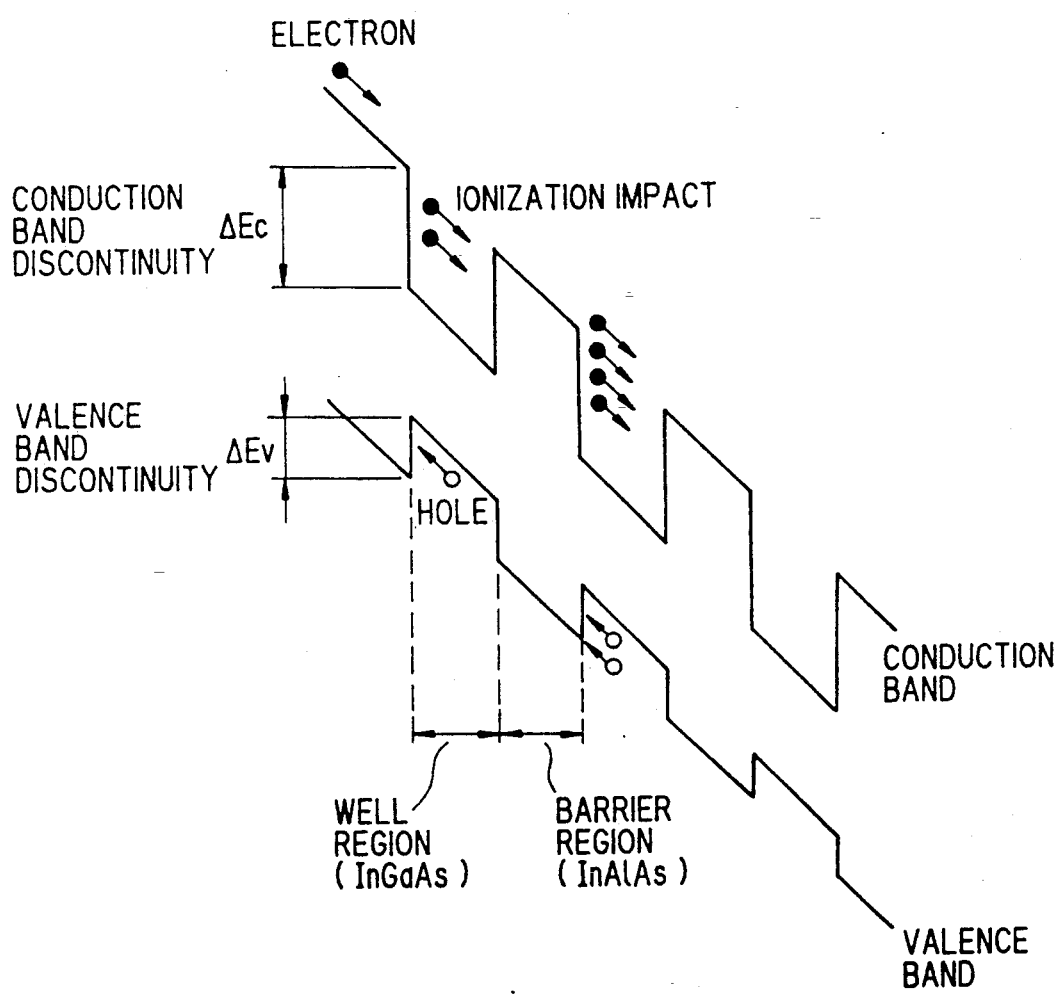
FIG. 2 is a simplified model illustrating the band energy in the first conventional avalanche photodiode.

FIG. 2 is a simplified model illustrating the band energy in the n-InP avalanche superlattice multiplication layer 11 in FIG. 1.

There are quantum wells and barriers existing alternately in the conduction band and the valence band, respectively. Each well has a conduction band discontinuity $\Delta Ec$ in the conduction band and $\Delta Ev$ in the valence band. The injected electrons get the conduction band discontinuity $\Delta Ec$ (approximately 0.5 eV) in kinetic energy at one end of the wells on transferring the avalanche multiplication layer, so that the ionization impacts increases, however the electrons also lose $\Delta Ec$ or is trapped at the other end of the wells.

FIG. 3 is a simplified model illustrating the band energy in an avalanche multiplication layer of a second conventional avalanche photodiode.

In this avalanche photodiode, the avalanche multiplication layer has basically the same structure as that in FIG. 2, except that a graded region is provided at the end of each well. The electrons are less trapped at the graded region, so that the electron ionization rate increases. However, it is difficult to grow a graded layer in which the impurity density changes gradually to have a predetermined density profile, as described before.

Next, FIG. 4 is a cross-sectional view illustrating an avalanche photodiode in a first preferred embodiment according to the invention.

The avalanche photodiode comprises an n-InP buffer layer 2 formed on an n-InP substrate 1, an n-superlattice avalanche multiplication layer 3 which is a multilayer structure formed on the n-InP buffer layer 2, an n-InGaAs light absorbing layer 4 formed on the n-superlattice avalanche multiplication layer 3, an n-InP window layer 5 formed on the n-InGaAs light absorbing layer 4, a p+-diffusion region 6 grown by the closed tube diffusion method using zinc phosphine formed within the n-InGaAs light absorbing layer 4 and the n-InP window layer 5, a passivation layer 7 which is $Si_3N_4$ layer covering the surface of the n-InP window layer 5, and a p-electrode 8 of AuZn and an n-electrode 9 of AuGeNi having ohmic contacts respectively with the the p+-diffusion region 6 and the n-InP substrate 1.

FIG. 5 is an explanatory view illustrating a vertical structure of one element layer of the multilayer structure of the n-superlattice avalanche multiplication layer 3 of the avalanche photodiode in FIG. 4.

One element layer of the multilayer structure comprises multilayers of an InAlAs barrier layer (500Å), an InGaAs well layer (500 Å), and a thin multilayer superlattice structure sandwiched between the barrier and well layers. The thin multilayer superlattice structure comprises a plurality of InAlAs short-width barrier layers (50Å) and a plurality of InGaAs short-width well layers (25 Å) which are alternately arranged to form a multilayer heterointerface structure. The width of the shortwidth well layer is preferably up to 100 Å to have a sufficiently high quantum level $E_{l,e}$, and the width of the short-width barrier layer is preferably also up to 100 Å to cause tunneling or becoming hotcarriers of the electrons. In FIG.5, four cycles of the short-width barrier and well layers are shown, however, there is no limitation in number of the layers.

Figure 6:
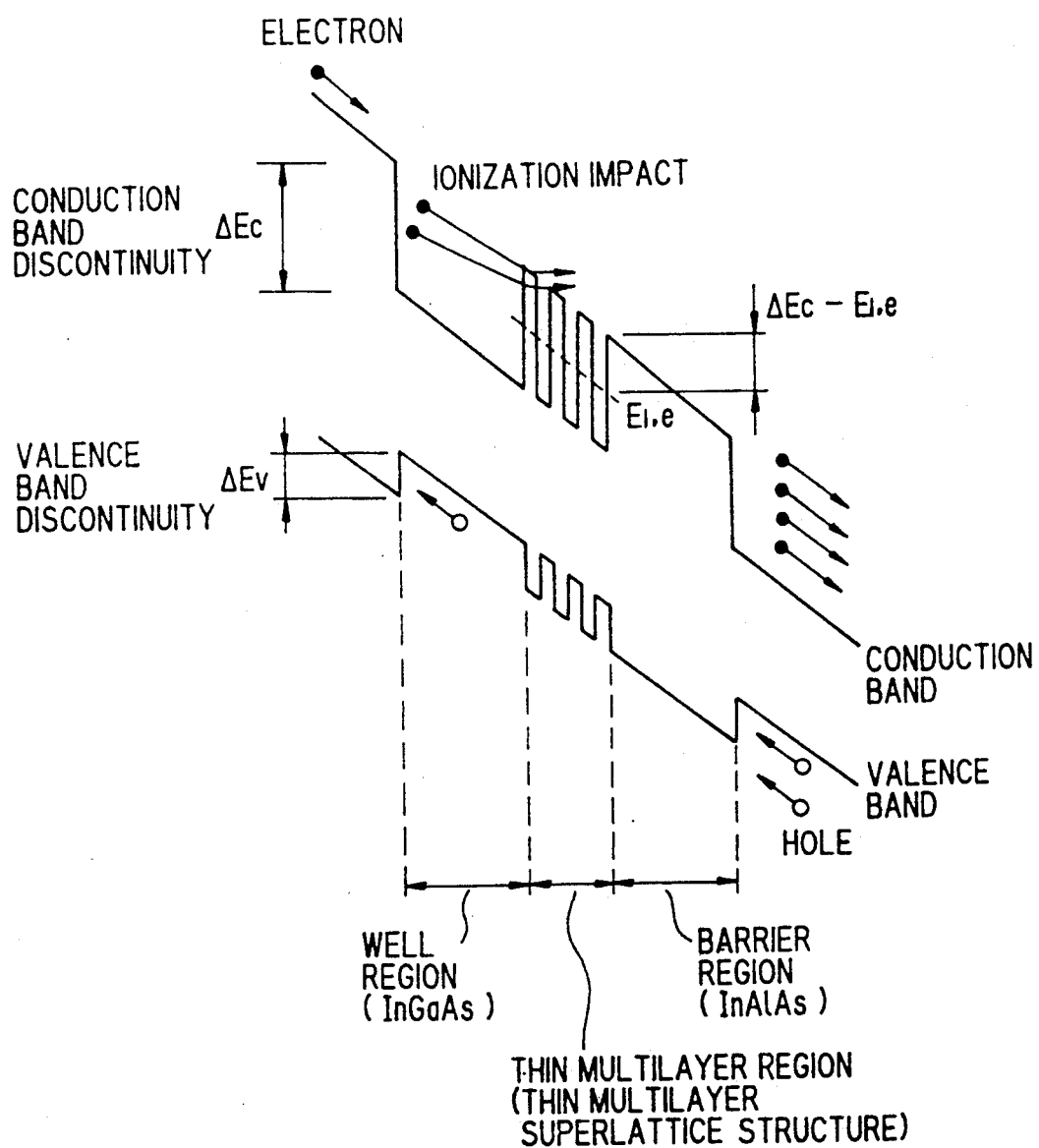
FIG. 6 is a simplified model illustrating the band energy in the avalanche photodiode in the first preferred embodiment according to the invention.

FIG. 6 is a simplified model illustrating the band energy in the n-supperlattice avalanche multiplication layer 3 of the avalanche photodiode in FIG. 4.

There is a thin multilayer region sandwiched between a well region and a barrier region in one cycle in the conduction band and the valence band, respectively. The thin multilayer region has a plurality of short-width barriers corresponding to the InAlAs short-width barrier layers and a plurality of short-width wells corresponding to the InGaAs shortwidth well layers alternately arranged.

Each well region has a conduction band discontinuity $\Delta Ec$ in the conduction band and $\Delta Ev$ in the valence band, as in FIG. 2. The injected electrons get the conduction band discontinuity $\Delta Ec$ in kinetic energy at one end of the well region. Due to the thin multilayer region, the conduction band discontinuity $\Delta Ec$ at the other end of the well region is virtually graded, so that the energy loss of the electrons and the electron trap effects may be reduced. Moreover, the short-width well is narrow enough to have a first quantum level $E_{l,e}$ higher by $\Delta Ec/2$ than the bottom level of the well region due to the width of the short-width well which is 25 Å, and the short-width barrier is narrow enough to cause the electrons to become hotcarriers or to cause tunneling effects. Consequently, the ionization impact rate of the electrons increases, so that the avalanche photodiode operates fast at a low applied field.

Figure 7:
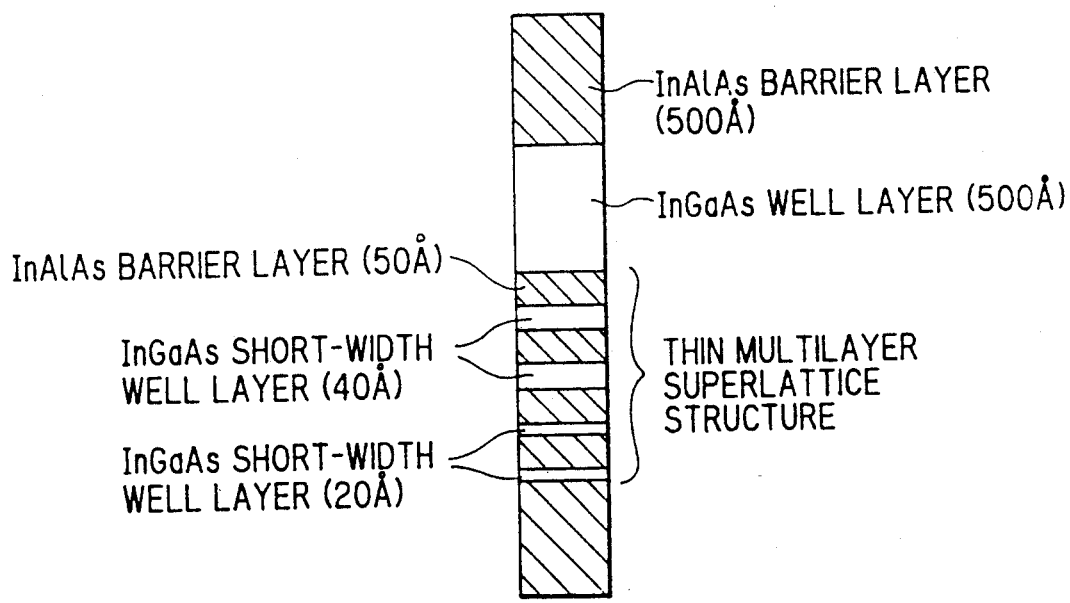
FIG. 7 is an explanatory view illustrating a vertical structure of one element layer of an nsuperlattice avalanche multiplication layer in an avalanche photodiode in a second preferred embodiment according to the invention.

Next, FIG. 7 is an explanatory view illustrating a vertical structure of one element layer of an n-superlattice avalanche multiplication layer in an avalanche photodiode in a second preferred embodiment according to the invention.

The basic structure of the avalanche photodiode in the second preferred embodiment is the same as that in the first preferred embodiment, except for the thin multilayer superlattice structure in which short-width well layers have narrower width as the location thereof becomes far from the well layer. In this embodiment shown in FIG. 7, the first and second short-width well layers have a thickness of 40 Å and the third and fourth thin well layers have a thickness of 20 Å.

In this structure, the conduction band discontinuity is virtually graded in more extend, and the first quantum level is higher by ($\frac{1}{3}\Delta Ec$) at the first and second short-width well layers relatively near the well layer and by ($\frac{2}{3}\Delta Ec$) at the third and fourth short-width well layers relatively far from the well layer than the bottom level of the well layer, so that the energy loss of the electrons and the electron trap effects may be much reduced.

Figure 8:
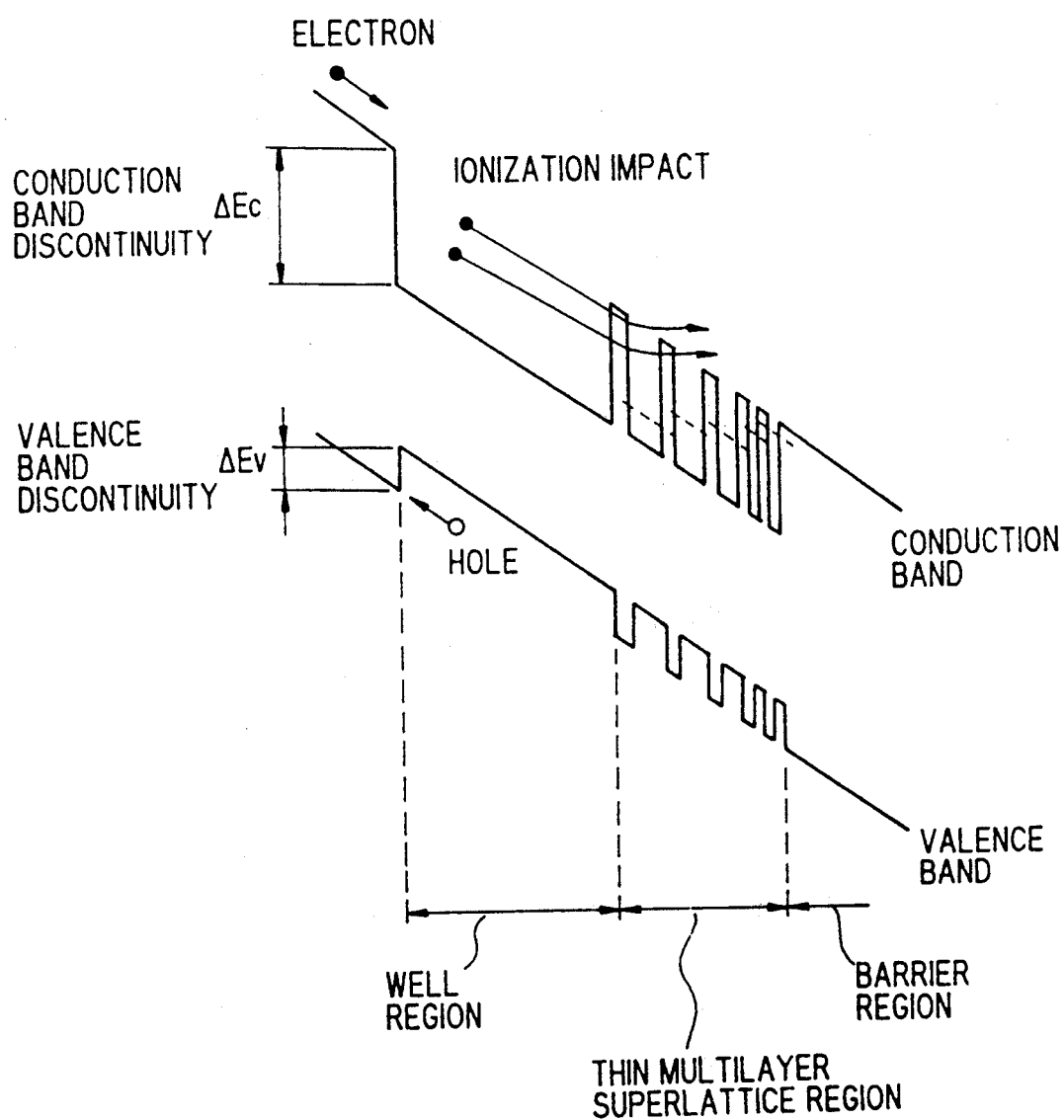
FIG. 8 is a simplified model illustrating the band energy in the avalanche photodiode in a third preferred embodiment according to the invention.

FIG. 8 is a simplified model illustrating the band energy in the avalanche multiplication layer of the avalanche photodiode in a third preferred embodiment. In this embodiment, the width of the short-width well layer changes from 35 Å to 15 Å by 5 Å as the distance from the well layer becomes large. In such a structure, the more effective advantage can be obtained compared with that in the first embodiment.

Figure 9:
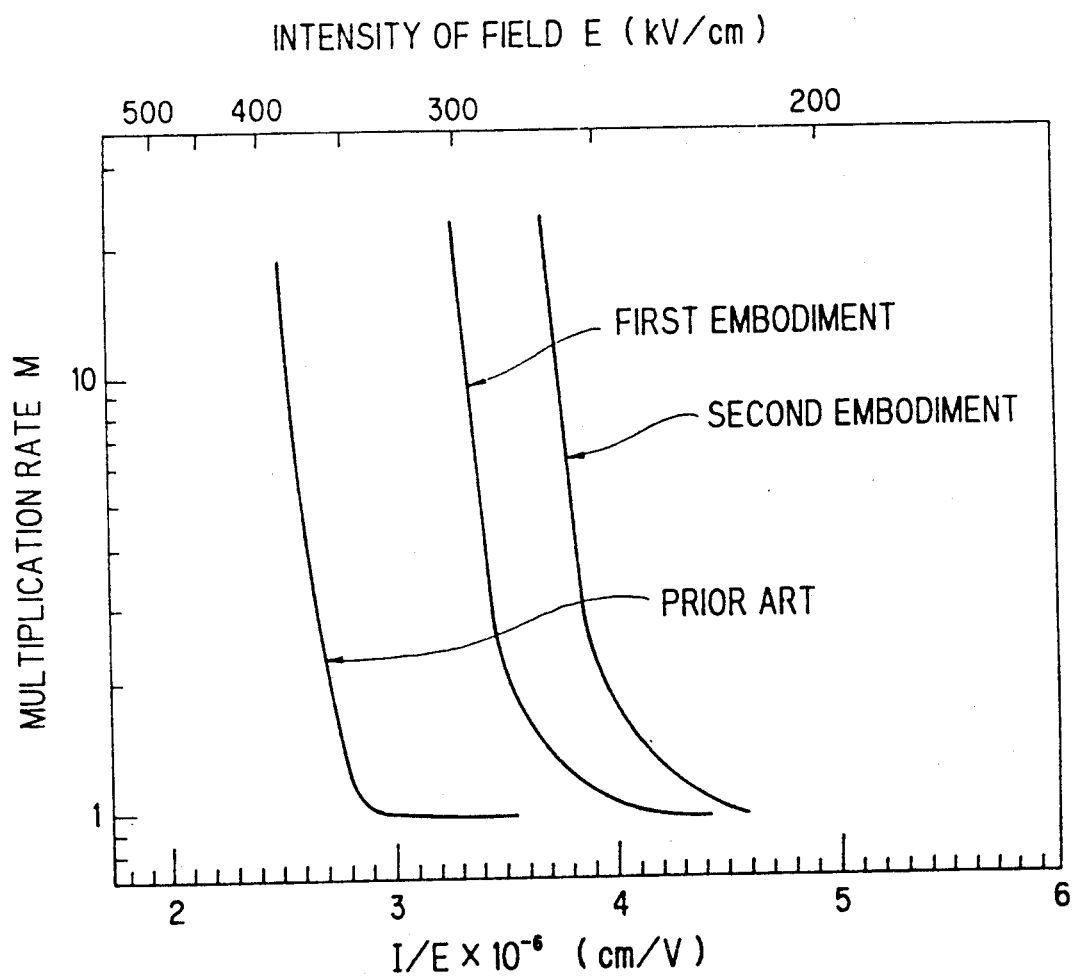
FIG. 9 is an explanatory diagram illustrating multiplication rate performances of the conventional and embodied avalanche photodiodes.

FIG. 9 is an explanatory diagram illustrating multiplication rate performances of the avalanche photodiodes.

As shown in FIG. 9, the multiplication occurs on a condition of the intensity of the applied field below approximately 300 kV/cm in the avalanche photodiodes in the first and second embodiments, while over 350 kV/cm in the conventional photodiode.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. AN avalanche photodiode, comprising:
   a first semiconductor layer for a light absorbing layer;
   a second semiconductor layer for an avalanche multiplication layer, said second semiconductor layer comprising a superlattice multilayer structure in which each element layer consisting of alternately provided short-width well and barrier layers is sandwiched between a well layer and a barrier layer, wherein both said short-width well and barrier layers have a thickness of up to 100 Å; and
   first and second electrodes coupled to said avalanche photodiode for applying a predetermined voltage across a region of said avalanche photodiode including said first and second semiconductor layers.

2. An avalanche photodiode, according to claim 1, wherein:
   a thickness of said short-width well layer becomes larger as the distance from said well layer becomes smaller, and becomes smaller as said distance becomes larger.

3. An avalanche photodiode, according to claim 1, wherein:
   said short-width well layer consists of InGaAs, and said short-width barrier layer consists of InAlAs.

* * * * *

UNITED STATES PATENT AND TRADEMARK OFFICE
CERTIFICATE OF CORRECTION

PATENT NO. : 5,187,553
DATED : Feb. 16, 1993
INVENTOR(S) : Kikuo MAKITA

It is certified that error appears in the above-identified patent and that said Letters Patent is hereby corrected as shown below:

Col. 1, line 43, delete ">" and insert --$\gg$--;

Col. 1, line 44, delete "<" and insert --$\ll$--.

Col. 2, line 8, delete "αmay" and insert --α may--;

Col. 2, line 50, delete "nsuperlattice" and insert --n-superlattice--;

Col. 2, line 58, delete "nsuperlattice" and insert --n-superlattice--.

Col. 3, line 13, delete "navalanche" and insert --n-avalanche--;

UNITED STATES PATENT AND TRADEMARK OFFICE
CERTIFICATE OF CORRECTION

PATENT NO. : 5,187,553
DATED : February 16, 1993
INVENTOR(S) : Kikuo MAKITA

It is certified that error appears in the above-indentified patent and that said Letters Patent is hereby corrected as shown below:

Col. 5, line 11, delete "extend" and insert --extent--.

Signed and Sealed this

Eighth Day of June, 1993

Attest:

MICHAEL K. KIRK

Attesting Officer       Acting Commissioner of Patents and Trademarks